(12) United States Patent
Kondo et al.

(10) Patent No.: US 12,500,409 B2
(45) Date of Patent: Dec. 16, 2025

(54) SURGE SUPPRESSION DEVICE (71) Applicant: Proterial, Ltd., Tokyo (JP)

(72) Inventors: Tsukasa Kondo, Tokyo (JP); Haruyasu Komano, Tokyo (JP)

(73) Assignee: Proterial, Ltd., Tokyo (JP)

( * ) Notice: Subject to any disclaimer, the term of this patent is extended or adjusted under 35 U.S.C. 154(b) by 111 days.

(21) Appl. No.: 18/449,962

(22) Filed: Aug. 15, 2023

(65) Prior Publication Data

US 2024/0072535 A1 Feb. 29, 2024

(30) Foreign Application Priority Data

Aug. 26, 2022 (JP) ................................. 2022-135089

(51) Int. Cl.
*H02H 9/04* (2006.01)
*H02K 11/20* (2016.01)
*H05K 1/02* (2006.01)
*H05K 1/18* (2006.01)
(Continued)

(52) U.S. Cl.
CPC ............. *H02H 9/044* (2013.01); *H02K 11/20* (2016.01); *H05K 1/0206* (2013.01); *H05K 1/184* (2013.01); *H05K 5/065* (2013.01); *H05K 7/205* (2013.01); *H05K 7/20509* (2013.01); *H05K 2201/10015* (2013.01); *H05K 2201/10022* (2013.01); *H05K 2201/10522* (2013.01)

(58) Field of Classification Search
CPC ........ H02H 9/044; H02K 11/20; H05K 1/206; H05K 1/209; H05K 1/184; H05K 54/065; H05K 7/205; H05K 7/20509; H05K 2203/1316; H05K 2203/1327; H05K 2201/0209; H05K 2201/0215; H05K 2201/10015; H05K 2201/10022; H05K 2201/10757; H05K 2201/10522
USPC .......................................................... 361/115
See application file for complete search history.

(56) References Cited

U.S. PATENT DOCUMENTS

2022/0045570 A1    2/2022   Sagawa et al.

FOREIGN PATENT DOCUMENTS

JP         S63200325 U   *  12/1988
JP         2004140914 A  *  5/2004
(Continued)

OTHER PUBLICATIONS

Machine translation of Japanese Patent Document Jp S63200325 U Dec. 1988 (Year: 1988).*

(Continued)

*Primary Examiner* — Kevin J Comber
(74) *Attorney, Agent, or Firm* — Studebaker Brackett PLLC (57) ABSTRACT

A surge suppression device is provided with a plurality of series circuits each of which includes a resistor and a capacitor that are connected in series, an embedding resin that embeds a plurality of the resistors constituting the plurality of series circuits, and a placement member that places a plurality of the capacitors constituting the plurality of series circuits. The plurality of resistors are arranged in parallel, and the embedding resin and the placement member are aligned in a direction of a plane parallel to both a resistor longitudinal direction which is a longitudinal direction of the resistor and a resistor alignment direction in which the plurality of resistors are aligned.

9 Claims, 7 Drawing Sheets

(51) Int. Cl.
*H05K 5/06* (2006.01)
*H05K 7/20* (2006.01)

(56) References Cited

FOREIGN PATENT DOCUMENTS

| | | | |
|---|---|---|---|
| JP | 2014132811 A | * | 7/2014 |
| JP | 2022-030554 A | | 2/2022 |

OTHER PUBLICATIONS

Machine translation of Japanese Patent Document Kezuka et al. JP 2004-140914 A May 2004 (Year: 2004).*
Machine translation of Japanese Patent Document Miyazaki et al. JP 2014-132811 A Jul. 2014 (Year: 2014).*
"Notice of Reasons for Refusal" Office Action issued in JP 2022-135089; mailed by the Japanese Patent Office on Oct. 7, 2025.

* cited by examiner

SURGE SUPPRESSION DEVICE

CROSS-REFERENCE TO RELATED APPLICATIONS

The present application is based on Japanese patent application No. 2022-135089 filed on Aug. 26, 2022, the entire contents of which are incorporated herein by reference.

TECHNICAL FIELD

The present invention relates to a surge suppression device.

BACKGROUND OF THE INVENTION

Patent Literature 1 discloses a surge suppression device that is connected to wiring between an inverter and a motor and suppresses surge voltage caused by switching operation of the inverter. The surge suppression unit described in Patent Literature 1 has three series circuits each composed of a resistor and a capacitor, and the three series circuits are arranged such that their ends on the capacitor side are connected to each other.

Citation List Patent Literature 1: JP2014-132811A

SUMMARY OF THE INVENTION

For surge suppression devices, having plural series circuits may cause an increase in size unless special measures are taken. There is a demand for reduction in thickness of surge suppression devices to be able to mount on, e.g., a device that generates surge voltages, but there is no detailed disclosure of the structure of the surge suppression device in Patent Literature 1.

The invention was made in view of such circumstances and it is an object of the invention to provide a surge suppression device that can be reduced in thickness.

To achieve the object described above, the invention provides a surge suppression device comprising: a plurality of series circuits each comprising a resistor and a capacitor that are connected in series; an embedding resin that embeds a plurality of the resistors constituting the plurality of series circuits; and a placement member that places a plurality of the capacitors constituting the plurality of series circuits, wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned.

Advantageous Effects of the Invention

According to the invention, it is possible to provide a surge suppression device that can be reduced in thickness.

DETAILED DESCRIPTION OF THE INVENTION

First Embodiment

The first embodiment of the invention will be described in reference to FIGS. 1 to 6. The embodiment below is described as a preferred example for implementing the invention. Although some part of the embodiment specifically illustrates various technically preferable matters, the technical scope of the invention is not limited to such specific aspects.

Figure 1:
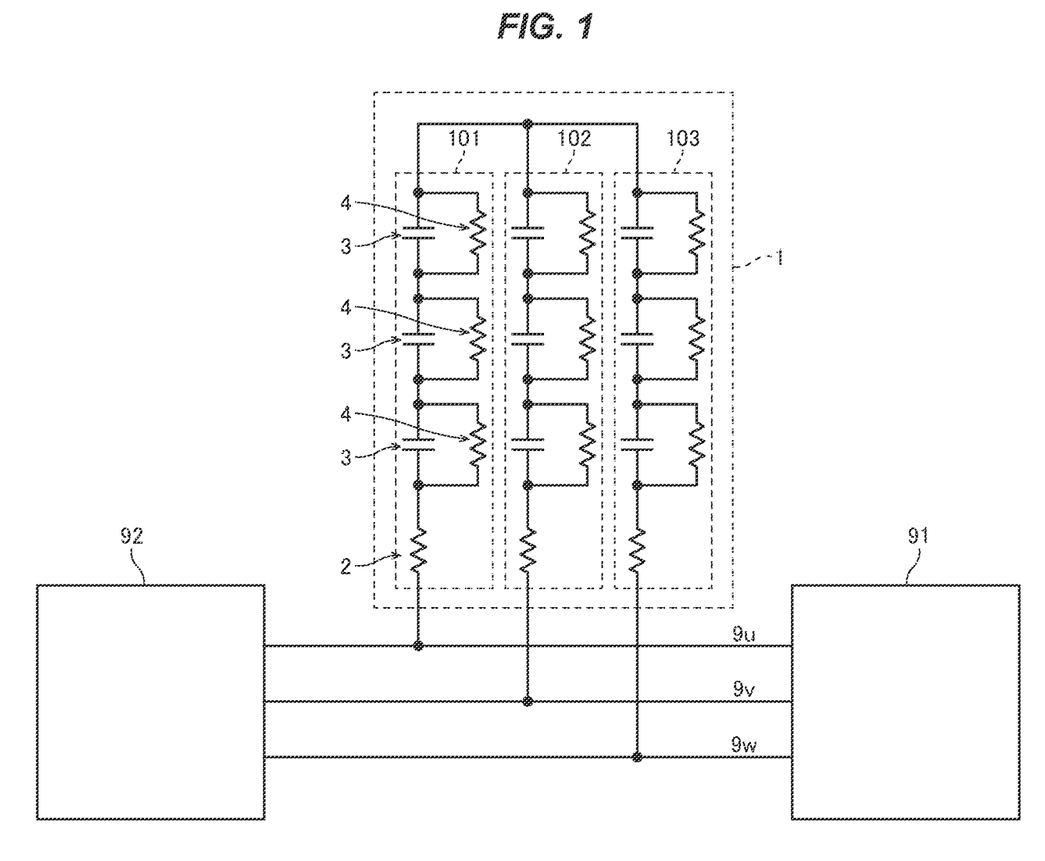
FIG. 1 is a circuit diagram showing a surge suppression device in the first embodiment when in use.

FIG. 1 is a circuit diagram showing a surge suppression device 1 when in use. The surge suppression device 1 in the first embodiment when in use is connected to, e.g., each of a U-phase wire 9u, a V-phase wire 9v, and a W-phase wire 9w between a motor 91 and an inverter 92. In this case, the surge suppression device 1 suppresses the application of surge voltage to the motor 91.

The surge suppression device 1 has three series circuits 101 to 103 in each of which a resistor 2 and capacitor(s) 3 are connected in series. In the first embodiment, each of the series circuits 101 to 103 has one resistor 2, and three capacitors 3 which are series-connected to the resistor 2. Each of the series circuits 101 to 103 further has three balancing resistors 4 respectively parallel-connected to the capacitors 3. The three series circuits 101 to 103 are respectively connected to the U-phase wire 9u, the V-phase wire 9v, and the W-phase wire 9w on the resistor 2-side. In addition, the three series circuits 101 to 103 are connected to each other on the side opposite to the resistor 2 and are thereby star-connected.

Figure 2:
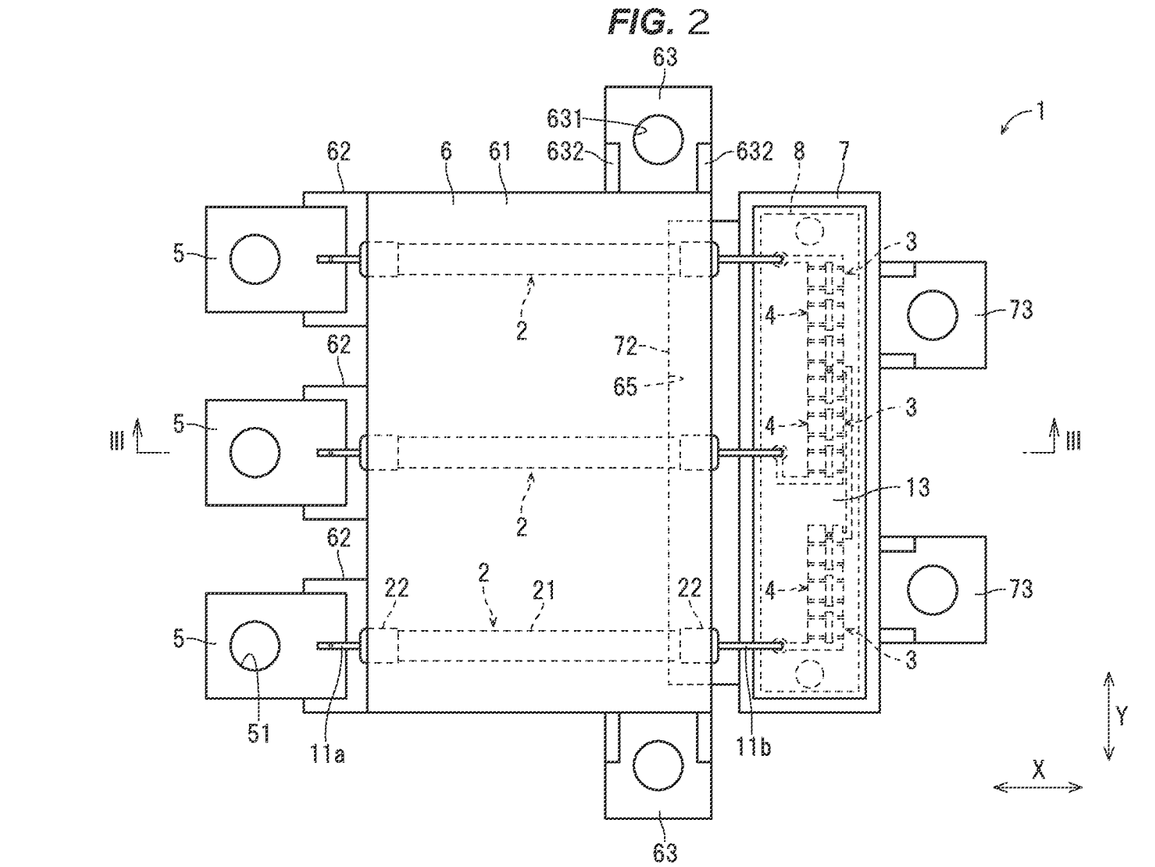
FIG. 2 is a plan view showing the surge suppression device in the first embodiment.
Figure 3:
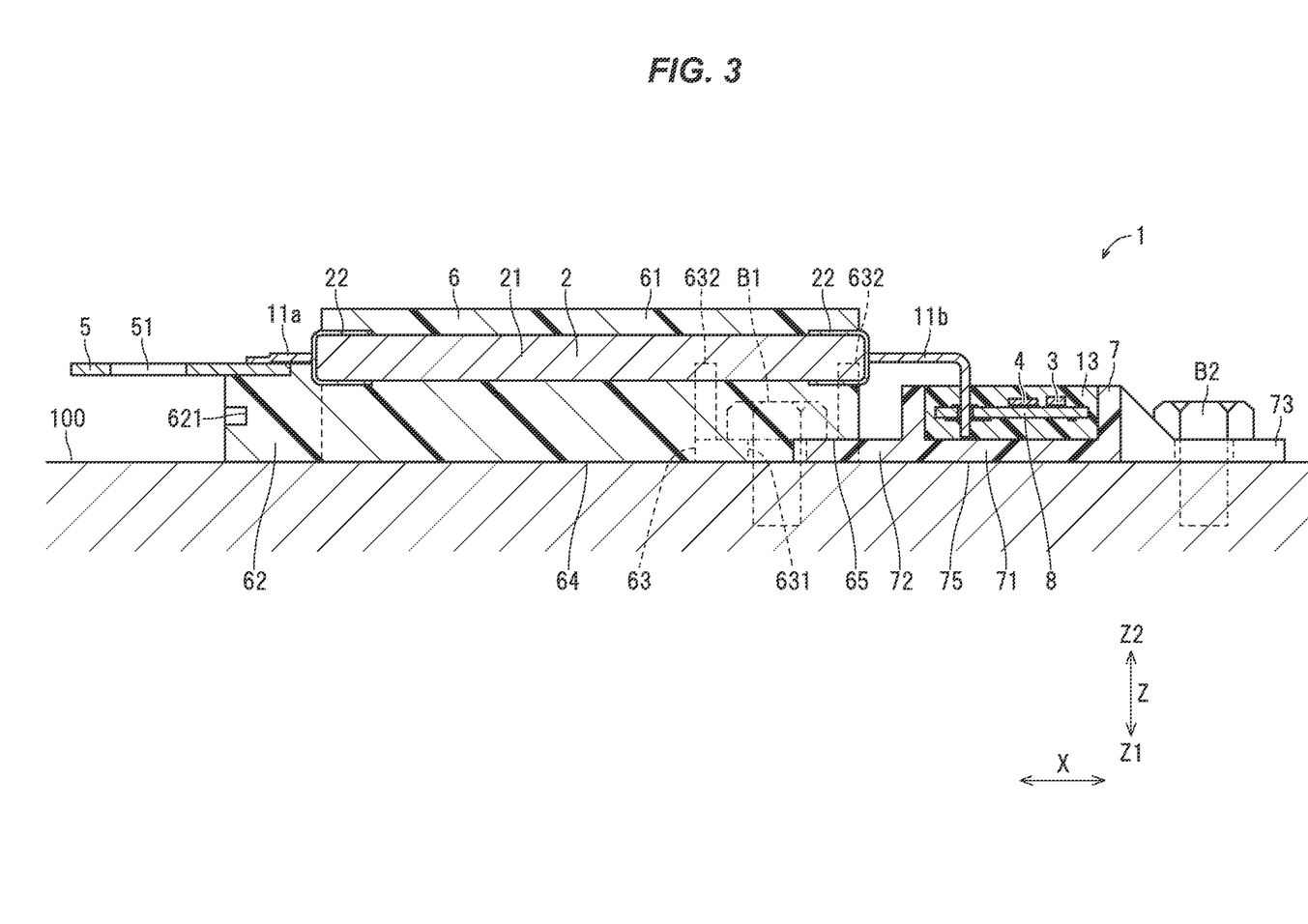
FIG. 3 is a cross-sectional view taken along line in FIG. 2 and as viewed in the direction of the arrow.

FIG. 2 is a plan view showing the surge suppression device 1. FIG. 3 is a cross-sectional view taken along line III-III in FIG. 2 and as viewed in the direction of the arrow. FIG. 3 also shows a fixing target 100 to which the surge suppression device 1 is fixed, and bolts B1 and B2, in addition to the surge suppression device 1.

The surge suppression device 1 has three resistors 2 arranged in parallel, three terminal portions 5 respectively connected to the three resistors 2 on one side, an embedding resin 6 that embeds the three resistors 2, a placement member 7 on which the capacitors 3 are placed, and a substrate 8 on which the capacitors 3 and the balancing resistors 4 are mounted. The embedding resin 6 and the placement member 7 are aligned in a direction of a plane parallel to both a resistor longitudinal direction X which is a longitudinal direction of the resistor 2, and a resistor alignment direction Y in which the plural resistors 2 are aligned side by side. In the first embodiment, the embedding resin 6 and the placement member 7 are aligned in the resistor longitudinal direction X. Hereinafter, a direction orthogonal to both the resistor longitudinal direction X and the resistor alignment direction Y is referred to as a height direction Z.

As shown in FIG. 3, the surge suppression device 1 when in use is fixed to the fixing target 100 located on one side in the height direction Z. When the surge suppression device 1 is arranged between an inverter (see the reference sign 92 in FIG. 1) and a motor (see the reference sign 91 in FIG. 1) as in the first embodiment, the fixing target 100 to which the surge suppression device 1 is fixed can be, e.g., a motor case. Hereinafter, one side in the height direction Z, which is a side where the fixing target 100 is located relative to the surge suppression device 1, is defined as a fixed side Z1, and the opposite side is defined as a non-fixed side Z2. Next, each part of the surge suppression device 1 will be described.

As shown in FIGS. 2 and 3, the resistor 2 includes a resistive element 21 which is long in the resistor longitudinal direction X, and two cap electrodes 22 fitted to both ends of the resistive element 21. The resistive element 21 is not particularly limited, and can be, e.g., a wire-wound resistive element or a ceramic resistive element. The cap electrode 22 is made of a conductive metal and is formed in a bottomed cylindrical shape.

Lead wires 11*a* and 11*b* are respectively connected to the two cap electrodes 22 of the resistor 2. The lead wire 11*a*, which is one of the two lead wires 11*a* and 11*b* connected to the resistor 2, is electrically connected to the terminal portion 5, and the other lead wire 11*b* is electrically connected to the substrate 8.

The terminal portion 5 has a plate shape having a thickness in the height direction Z. The terminal portion 5 has a bolt insertion hole 51 that penetrates the terminal portion 5 in the height direction Z. A bolt (not shown) to electrically connect the terminal portion 5 to the U-phase wire (see the reference sign 9*u* in FIG. 1), the V-phase wire (see the reference sign 9*v* in FIG. 1), or the W-phase wire (see the reference sign 9*w* in FIG. 1) is inserted into the bolt insertion hole 51.

The embedding resin 6 has a shape which is flat in the direction of the plane parallel to both the resistor longitudinal direction X and the resistor alignment direction Y. The embedding resin 6 is a molded resin with the three resistors 2 molded therein. In the first embodiment, the embedding resin 6 is formed by molding the three resistors 2 and the three terminal portions 5 thereinto. In the first embodiment, the embedding resin 6 integrally has a rectangular parallelepiped-shaped portion 61 having a thickness in the height direction Z, three terminal holding portions 62 protruding in the resistor longitudinal direction X from the rectangular parallelepiped-shaped portion 61 toward the three terminal portions 5, and two embedding resin fixing portions 63 protruding from the rectangular parallelepiped-shaped portion 61 on both sides in the resistor alignment direction Y.

The three resistors 2 are embedded in the rectangular parallelepiped-shaped portion 61. In the first embodiment, the resistors 2 are embedded in the embedding resin 6, with both ends in the resistor longitudinal direction X exposed from the embedding resin 6. However, it is not limited thereto, and the configuration may be such that, e.g., each resistor 2 is entirely embedded in the embedding resin 6 and at least portions of the two lead wires 11*a* and 11*b* connected to the resistor 2 protrude from the embedding resin 6. As shown in FIG. 3, the resistors 2 are arranged off-center and located on the non-fixed side Z2 of the embedding resin 6. This increases a heat transfer distance from the three resistors 2 to the capacitors 3 through the embedding resin 6 and the placement member 7, etc.

As shown in FIG. 2, the three terminal holding portions 62 are formed on the fixed side Z1 relative to the three terminal portions 5 and hold the three terminal portions 5. Each terminal holding portion 62 is formed wider than the terminal held thereby so as to protrude on both sides in the resistor alignment direction Y. As shown in FIG. 3, the terminal portion 5 is embedded on the non-fixed side Z2 of each terminal holding portion 62. In the first embodiment, an end portion of the terminal portion 5 on the rectangular parallelepiped-shaped portion 61 side is embedded by its thickness in the terminal holding portion 62.

On an end face of the terminal holding portion 62 on the opposite side to the rectangular parallelepiped-shaped portion 61, a recessed portion 621 is formed to increase a creepage distance between the terminal portion 5 and the fixing target 100 and thereby improve electrical insulation between the terminal portion 5 and the fixing target 100. The recessed portion 621 is formed at a position overlapping the terminal portion 5 when viewed in the height direction Z. In the first embodiment, the recessed portion 621 is formed in a width region in the resistor alignment direction Y substantially the same as a width region in which the terminal portions 5 are formed. However, it is not limited thereto and the recessed portion 621 may be formed over the entire length of the terminal holding portion 62 in the resistor alignment direction Y. Alternatively, the terminal holding portion 62 may have a raised portion instead of the recessed portion 621 as long as the creepage distance between the terminal portion 5 and the fixing target 100 can be increased.

The embedding resin fixing portion 63 is a portion that fixes the embedding resin 6 to the fixing target 100. The embedding resin fixing portion 63 has a bolt insertion hole 631 formed to penetrate in the height direction Z. The bolt B1 is inserted into the bolt insertion hole 631 and is screwed into the fixing target 100, and the embedding resin fixing portion 63 is thereby fixed to the fixing target 100.

As shown in FIGS. 2 and 3, the embedding resin fixing portions 63 are formed at an end of the embedding resin 6 on the placement member 7 side in the resistor longitudinal direction X. In addition, at least a portion of each embedding resin fixing portion 63 is arranged at the same position in the resistor longitudinal direction X (i.e., an alignment direction of the embedding resin 6 and the placement member 7) as at least a portion of an extension portion 72 (described later) of the placement member 7. Ribs 632 to reinforce the embedding resin fixing portion 63 are formed on the embedding resin fixing portion 63. The embedding resin fixing portion 63 may be made of a metal, etc., to ensure rigidity. In this case, for example, a metal member constituting the embedding resin fixing portion 63 may be molded into the embedding resin 6.

As shown in FIG. 3, an embedding resin attachment surface 64, which is a surface of the embedding resin 6 on the fixed side Z1, faces the fixing target 100 in the state in which the surge suppression device 1 is fixed to the fixing target 100. In the first embodiment, the embedding resin attachment surface 64 is a flat surface composed of respective surfaces of the rectangular parallelepiped-shaped portion 61, the three terminal holding portions 62 and the two embedding resin fixing portions 63 on the fixed side Z1.

An insertion recess 65 into which an extension portion 72 (described later) of the placement member 7 is inserted is formed at an end of the embedding resin attachment surface 64 on the placement member 7-side in the resistor longitudinal direction X. The insertion recess 65 is a recessed portion that is open on the fixed side Z1 in the height direction Z and is also open on the placement member 7 side in the resistor longitudinal direction X.

The embedding resin 6 is made of an electrically insulating base resin that contains a filler having a higher thermal conductivity than the base resin. The base resin is made of, e.g., an electrically insulating resin such as PPS (polyphenylene sulfide) resin, or epoxy resin. The filler can be composed of, e.g., metal powder or ceramic powder, and specifically, powder of aluminum oxide, boron nitride or aluminum nitride, etc. Thermal conductivity of the embedding resin 6 is preferably 3 W/(m·K) or more. Also, the thermal conductivity of the embedding resin 6 can be set to 10 W/(m·K) or les. The placement member 7 is arranged on one side of the embedding resin 6 in resistor longitudinal direction X. In the first embodiment, the embedding resin 6 and the placement member 7 are aligned in a direction intersecting a thickness direction of the embedding resin 6 (i.e., the height direction Z).

Figure 4:
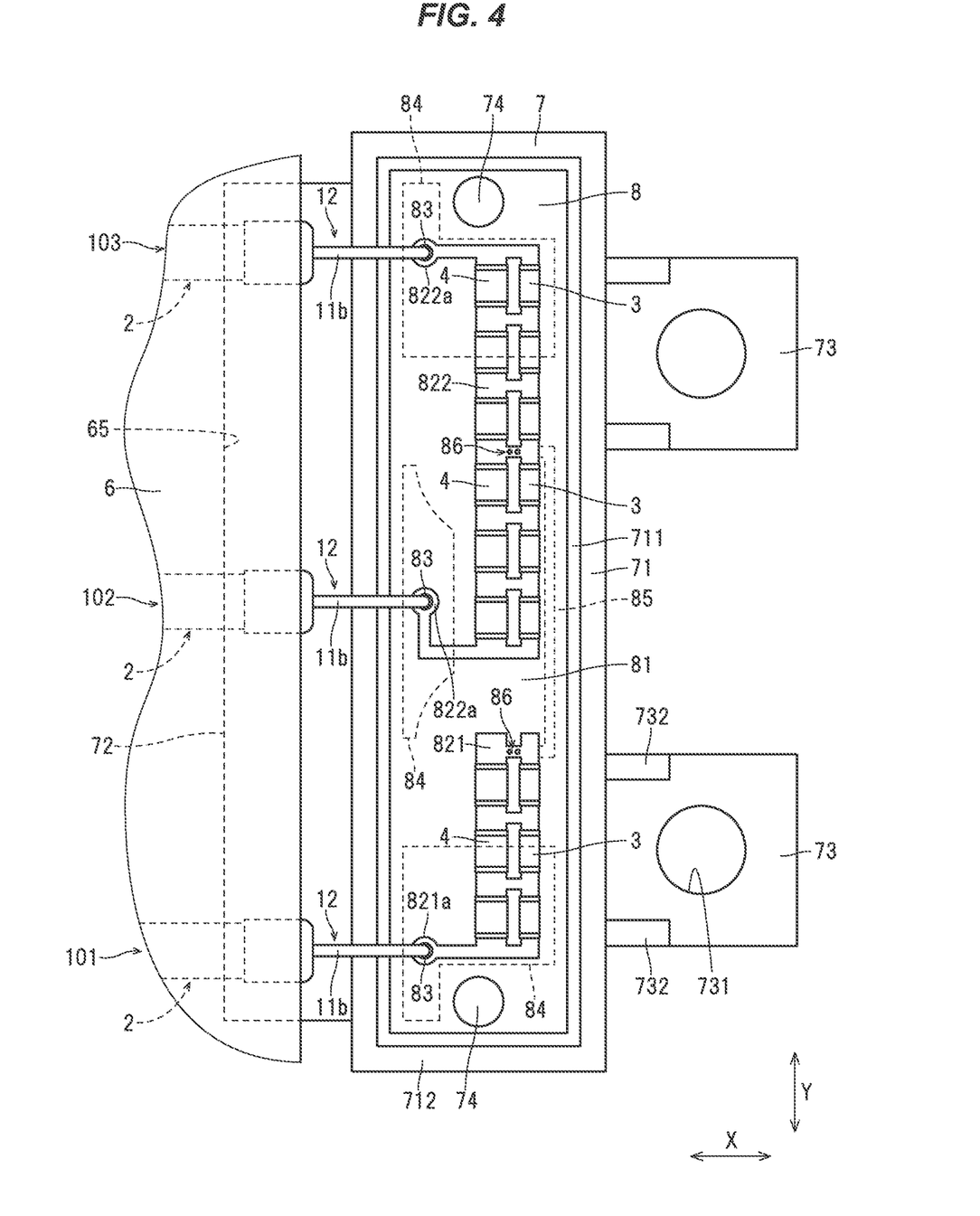
FIG. 4 is an enlarged view of FIG. 2 and shows a portion around a placement member.
Figure 5:
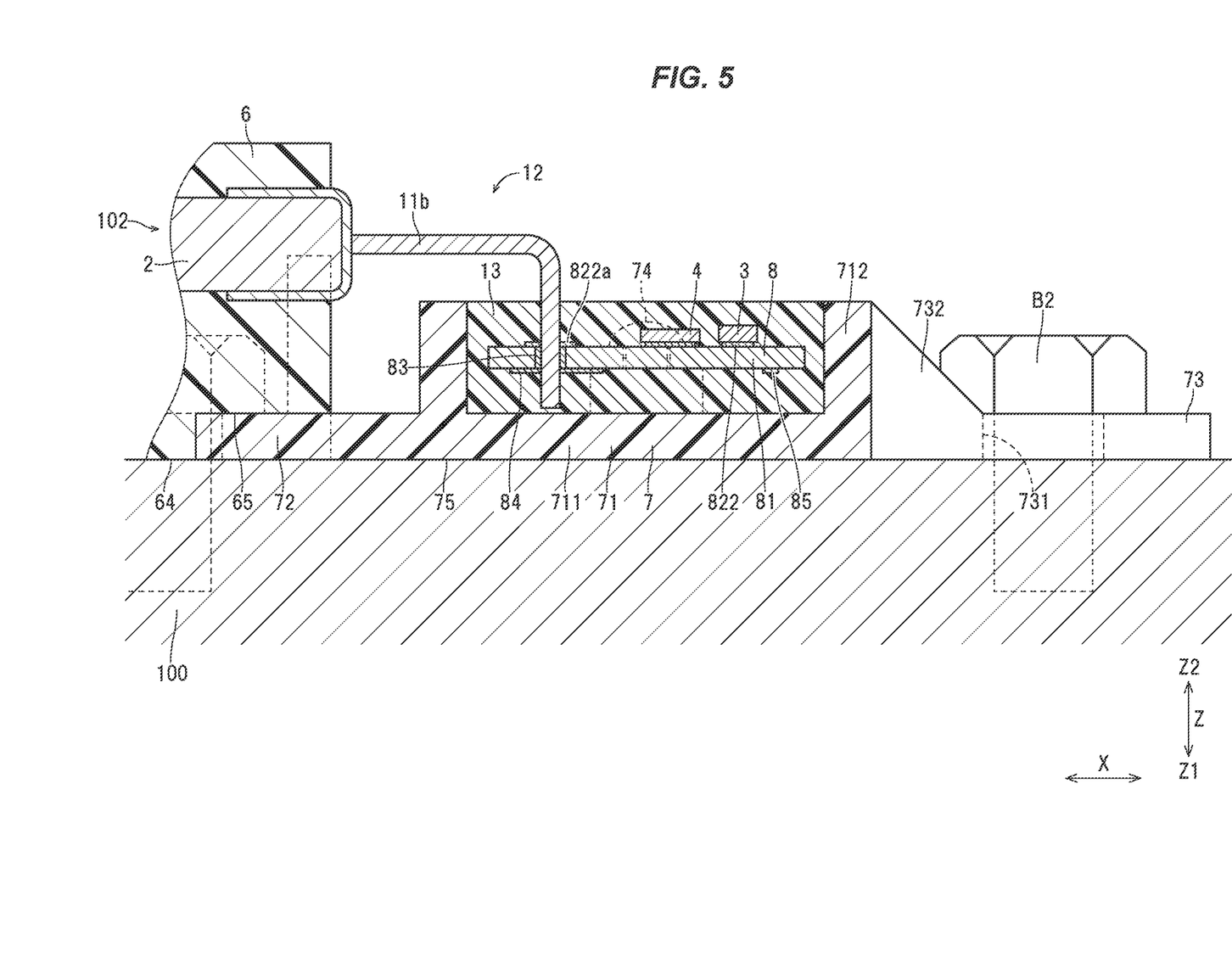
FIG. 5 is an enlarged view of FIG. 3 and shows a portion around the placement member.

FIG. 4 is an enlarged view of FIG. 2 and shows a portion around the placement member 7. FIG. 5 is an enlarged view of FIG. 3 and shows a portion around the placement member 7. In FIG. 4, a sealing resin (see the reference sign 13 in FIG. 5), which will be described later, is omitted for the sake of convenience.

The placement member 7 integrally has a placement portion 71 that places the substrate 8 having a thickness in the height direction Z, the extension portion 72 extending from the placement portion 71 toward the embedding resin 6 in the resistor longitudinal direction X, and two placement member fixing portions 73 extending in the resistor longitudinal direction X from the placement portion 71 toward the side opposite to the side where the extension portion 72 extends.

The placement portion 71 is formed in a shape of a case that is open on the non-fixed side Z2 in the height direction Z. The placement portion 71 has a rectangular bottom portion 711 which is long in the resistor alignment direction Y, and a rectangular cylinder-shaped side portion 712 erected from the bottom portion 711 toward the non-fixed side Z2. Caulking portions (i.e., boss portions) 74 are formed on a side in the height direction Z where the side portion 712 is erected from the bottom portion 711. The caulking portions 74 fix the substrate 8 by caulking (i.e., crimping, riveting) such as heat caulking. In this regard, the method of fixing the substrate 8 to the placement portion 71 is not limited thereto.

The extension portion 72 extends from an end of the placement portion 71 on the fixed side Z1 toward the embedding resin 6 in the resistor longitudinal direction X. The extension portion 72 is formed in a rectangular plate shape which has a thickness in the height direction Z and is long in the resistor alignment direction Y. An end portion of the extension portion 72 on the extended side is inserted into the insertion recess 65 of the embedding resin 6. The extension portion 72 is fixed to an inner surface of the insertion recess 65 by welding, etc. The placement member 7 is thereby integrated with the embedding resin 6 at the extension portion 72. Alternatively, the embedding resin 6 and the placement member 7 may be integrated by, e.g., molding the embedding resin 6 with the placement member 7 molded therein.

The extension portion 72 is located on the fixed side Z1 of an exposed conductive portion 12 which is a portion of a conductive path from the resistor 2 to the capacitors 3 in each of the series circuits 101 to 103 and is exposed to the outside of the surge suppression device 1. That is, the extension portion 72 is formed to interpose between the exposed conductive portions 12 and the fixing target 100. In the first embodiment, each exposed conductive portion 12 is composed of a portion of the resistor 2 exposed from the embedding resin 6 on the placement member 7-side in the resistor longitudinal direction X, and a portion of the lead wire 11b connected to said portion of the resistor 2 and exposed from the sealing resin 13 (described later).

The placement member fixing portion 73 is a portion that fixes the placement member 7 to the fixing target 100. The placement member fixing portion 73 has a bolt insertion hole 731 formed to penetrate in the height direction Z. The bolt B2 is inserted into the bolt insertion hole 731 and is screwed into the fixing target 100, and the placement member fixing portion 73 is thereby fixed to the fixing target 100.

As shown in FIG. 2, the two placement member fixing portions 73 are located at one end of the surge suppression device 1 on the opposite side to the three terminal portions 5. Then, the embedding resin fixing portions 63 are formed at a substantially central position between the three terminal portions 5 and the two placement member fixing portions 73 in the resistor longitudinal direction X. By arranging the three terminal portions 5, the two embedding resin fixing portions 63 and the two placement member fixing portions 73 as described above, the surge suppression device 1 can be fixed to the fixing target 100 and the three terminal portions 5 to other terminals to be connected thereto, etc., in a well-balanced manner. As shown in FIGS. 4 and 5, ribs 732 to reinforce the placement member fixing portion 73 are formed on the placement member fixing portion 73. The placement member fixing portion 73 may be made of a metal, etc., to ensure rigidity. In this case, for example, a metal member constituting the placement member fixing portion 73 may be molded into the placement member 7.

As shown in FIG. 5, a placement member attachment surface 75, which is a surface of the placement member 7 on the fixed side Z1, faces the fixing target 100 in the state in which the surge suppression device 1 is fixed to the fixing target 100. In the first embodiment, the placement member attachment surface 75 is a flat surface composed of respective surfaces of the placement portion 71, the extension portion 72 and the two placement member fixing portions 73 on the fixed side Z1.

As shown in FIG. 3, the placement member attachment surface 75 and the embedding resin attachment surface 64 are formed coplanar. This allows the surge suppression device 1 to face a planar surface portion of the fixing target 100 at the embedding resin attachment surface 64 as well as the placement member attachment surface 75, which improves heat dissipation from the surge suppression device 1 to the fixing target 100. Here, the embedding resin attachment surface 64 and the placement member attachment surface 75 being formed "coplanar" means that the embedding resin attachment surface 64 and the placement member attachment surface 75 is designed to be arranged in the same plane and slight misalignment between the position of the embedding resin attachment surface 64 and the position of the placement member attachment surface 75 due to, eg., dimensional tolerances of each part or assembly tolerances, etc. is acceptable. In the first embodiment, the embedding resin attachment surface 64 and the placement member attachment surface 75 are adjacent to each other and are formed flush with each other.

The placement member 7 is made of an electrically insulating material and, in the first embodiment, is made of an electrically insulating base resin that contains a filler having a higher thermal conductivity than the base resin. The placement member 7 can be made of the same resin as the embedding resin 6, but a different material may be used. The substrate 8 is housed in the placement member 7.

As shown in FIGS. 4 and 5, the substrate 8 is, e.g., a printed circuit board (PCB). In case where it is necessary to mount a large number of capacitors 3 and a large number of balancing resistors 4 as in the surge suppression device 1 of the first embodiment, it is highly achievable when using the substrate 8. The substrate 8 has a base 81, front-side patterns 821 and 822, heat dissipation vias 83, back-side heat dissipation patterns 84, and a back-side connection pattern 85. The base 81 is made of an electrically insulating material and formed in a plate shape.

The front-side patterns 821 and 822 are formed on a surface of the base 81 on the non-fixed side Z2. Plural capacitors 3 (nine in the first embodiment) and plural balancing resistors 4 (nine in the first embodiment) are mounted on the front-side patterns 821 and 822. In the first embodiment, the capacitors 3 are chip capacitors and the balancing resistors 4 are chip resistors. Hereinafter, for convenience, the three series circuits 101 to 103 will be referred to as the first series circuit 101, the second series circuit 102, and the third series circuit 103 sequentially from one side in the resistor alignment direction Y.

As shown in FIG. 4, the front-side patterns 821 and 822 are the first front-side pattern 821 constituting the first series circuit 101, and the second front-side pattern 822 constituting the second series circuit 102 and the third series circuit 103.

The first front-side pattern 821 has a land 821a to which the lead wire 11b extending from the resistor 2 of the first series circuit 101 is connected. The three capacitors 3 and three balancing resistors 4 of the first series circuit 101 are mounted on the first front-side pattern 821. The three capacitors 3 of the first series circuit 101 are aligned in the resistor alignment direction Y, and the three balancing resistors 4 of the first series circuit 101 are located on the resistor 2 side of the three capacitors 3 in the resistor longitudinal direction X and aligned in the resistor alignment direction Y.

The second front-side pattern 822 has two lands 822a to which the two lead wires 11b extending from the respective resistors 2 of the second series circuit 102 and the third series circuit 103 are connected. Then, the three capacitors 3 and the three balancing resistors 4 constituting the second series circuit 102 and the three capacitors 3 and the three balancing resistors 4 constituting the third series circuit 103 are mounted on the conductive path between the two lands 822a of the second front-side pattern 822. The six capacitors 3 constituting the second series circuit 102 and the third series circuit 103 are aligned in the resistor alignment direction Y, and the six balancing resistors 4 constituting the second series circuit 102 and the third series circuit 103 are located on the resistor 2 side of the six capacitors 3 in the resistor longitudinal direction X and aligned in the resistor alignment direction Y. Arranging the capacitors 3 on the opposite side to the resistors 2 relative to the balancing resistors 4 facilitates to have an enough heat transfer distance between the capacitors 3 having relatively low heat resistance and the resistors 2.

The heat dissipation vias 83 are formed in the middle of a heat transfer path from the resistor 2 to the capacitors 3 in each of the series circuits 101 to 103. In the first embodiment, three heat dissipation vias 83 are provided respectively on the inner sides of one land 821a of the first front-side pattern and the two lands 822a of the second front-side pattern. In each of the series circuits 101 to 103, the heat dissipation via 83 serves to release heat to the back side of the substrate 8 in the middle of the heat transfer path from the resistor 2 to the capacitors 3 through the lead wire 11b and the first front-side pattern 821 or the second front-side pattern 822.

Figure 6:
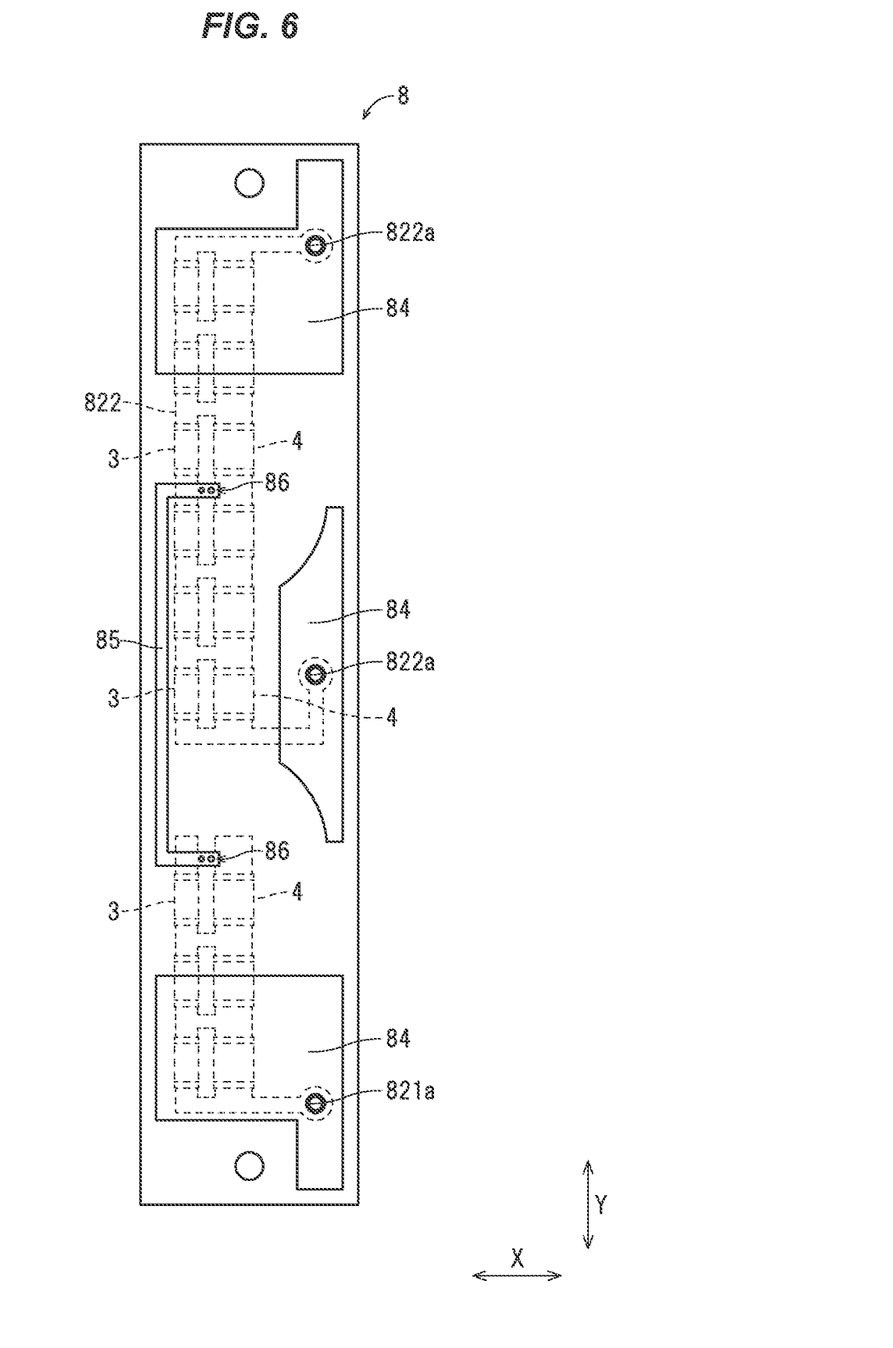
FIG. 6 is a bottom view showing a substrate in the first embodiment.

FIG. 6 is a bottom view showing the substrate 8. In the first embodiment, three back-side heat dissipation patterns 84 are provided. The three back-side heat dissipation patterns 84 are formed at a distance from each other and are respectively connected to different heat dissipation vias 83. Each back-side heat dissipation pattern 84 is formed to have a large area to improve heat dissipation while maintaining a predetermined distance from other current-carrying portions to prevent electrical conduction to the other current-carrying portions.

The back-side connection pattern 85 electrically connects the first front-side pattern 821 to the second front-side pattern 822. The back-side connection pattern 85 electrically connects an end of the first front-side pattern 821 located farther from the land 821a to a portion of the second front-side pattern 822 located between the second series circuit 102 and the third series circuit 103 through plural connection vias 86.

As shown in FIG. 5, components in the placement portion 71 are sealed with the sealing resin 13. The sealing resin 13 is made of, e.g., a potting resin having thermal conductivity. The sealing resin 13 also fills between the substrate 8 and the bottom portion 711 of the placement portion 71 to promote heat transfer from the substrate 8 to the bottom portion 711 of the placement portion 71.

Functions and Effects of the First Embodiment

In the surge suppression device 1 of the first embodiment, the embedding resin 6 and the placement member 7 are aligned in a direction of a plane parallel to both the resistor longitudinal direction X and the resistor alignment direction Y (in the first embodiment, aligned in the resistor longitudinal direction X). Therefore, the surge suppression device 1 can be reduced in thickness in the height direction Z. In addition, the three resistors 2, which constitute the three series circuits 101 to 103, are embedded in the embedding resin 6, and the nine capacitors 3, which constitute the three series circuit circuits 101 to 103, are placed on the placement member 7. Therefore, heat of the resistors 2 can be dissipated through the embedding resin 6, and transfer of heat of the resistors 2 to the capacitors 3 can be suppressed by placing the capacitors 3 on the placement member 7 which is a separate member from the embedding resin 6. It is thereby possible to improve heat dissipation of the surge suppression device 1 and to suppress temperature rise of the capacitors 3 having relatively low heat resistance.

In addition, the embedding resin attachment surface 64 of the embedding resin 6 and the placement member attachment surface 75 of the placement member 7 are formed coplanar. Therefore, the embedding resin attachment surface 64 and the placement member attachment surface 75 easily face the planar surface portion of the fixing target 100, and heat dissipation from each of the embedding resin 6 and the placement member 7 to the fixing target 100 is improved.

In addition, the placement member 7 has the placement portion 71 that places the capacitors 3, and the extension portion 72 extending from the placement portion 71 toward the embedding resin 6. The placement member 7 is integrated with the embedding resin 6 at the extension portion 72. Therefore, independent vibration of the embedding resin 6 and the placement member 7 can be suppressed when, e.g., external vibration is applied to the surge suppression device 1. As a result, e.g., in the first embodiment, application of stress to the exposed conductive portions 12 is suppressed.

In addition, the extension portion 72 is located on the fixed side Z1 of the exposed conductive portions 12. That is, the extension portion 72 is interposed between the exposed conductive portions 12 and the fixing target 100 in the state in which the surge suppression device 1 is fixed to the fixing target 100. It is thereby possible to ensure electrical insulation between the exposed conductive portions 12 and the fixing target 100.

In addition, at least a portion of the extension portion 72 and at least a portion of the embedding resin fixing portions 63 are arranged at the same position in the alignment direction of the embedding resin 6 and the placement member 7 (in the first embodiment, in the resistor longitudinal direction X). Thus, when the surge suppression device 1 is fixed to the fixing target 100 at the embedding resin fixing portions 63, the embedding resin 6 is pressed against the extension portion 72 and the extension portion 72 is pressed toward the fixing target 100. Therefore, the heat transfer between the embedding resin 6 and the extension portion 72 can be improved, and the heat transfer between the extension portion 72 and the fixing target 100 can also be improved. As a result, heat transfer from the surge suppression device 1 to the fixing target 100 is improved. In this regard, a level difference may occur at a connecting portion between the extension portion 72 and the embedding resin 6, and this causes the connecting portion between the extension portion 72 and the embedding resin 6 to be easily lifted off the fixing target 100 in the state in which the surge suppression device 1 is fixed to the fixing target 100. In the first embodiment, since the embedding resin fixing portion 63 is located at the position described above, a fixing force of the embedding resin fixing portion 63 is likely to act on the connecting portion between the extension portion 72 and the embedding resin 6 and lifting of the connecting portion from the fixing target 100 is suppressed.

In addition, the embedding resin fixing portions 63 that fixes to the fixing target 100 are provided on the embedding resin 6, and the placement member fixing portions 73 that fixes to the fixing target 100 are provided on the placement member 7. It is thus possible to independently fix the embedding resin 6 and the placement member 7 to the fixing object 100. It is thereby possible to suppress, e.g., generation of stress in the exposed conductive portions 12 due to independent vibration of the embedding resin 6 and the placement member 7. Furthermore, in the state in which the surge suppression device 1 is fixed to the fixing target 100, both heat dissipation from the embedding resin 6 to the fixing target 100 and heat dissipation from the placement member 7 to the fixing target 100 can be improved.

In addition, the plural capacitors 3 are mounted on the substrate 8 having a thickness in a direction intersecting both the resistor longitudinal direction X and the resistor alignment direction Y (in the first embodiment, in the height direction Z), and the substrate 8 is placed in the placement member 7. It is thereby possible to reduce the thickness of the surge suppression device 1 even when the substrate 8 is used.

In addition, the substrate 8 has the front-side patterns 821 and 822 on which the plural capacitors 3 are mounted, the heat dissipation vias 83 connected to the conductive paths of the front-side patterns 821 and 822 between the resistors 2 and the capacitors 3, and the back-side heat dissipation patterns 84 that are formed on the substrate 8 on the opposite side to the side with the front-side patterns 821 and 822 and are connected to the heat dissipation vias 83. Therefore, heat transferred from the resistors 2 to the front-side patterns 821 and 822 is released through the heat dissipation vias 83 to the back-side heat dissipation patterns 84 before reaching the capacitors 3 and is dissipated from the back-side heat dissipation patterns 84. Therefore, the heat transferred from the resistors 2 to the capacitors 3 can be reduced, and the temperature rise of the capacitors 3 can be suppressed.

In addition, the embedding resin 6 contains a base resin and a filler having a higher thermal conductivity than the base resin. The thermal conductivity of the embedding resin 6 can thereby be increased. As a result, in the state in which the surge suppression device 1 is fixed to the fixing target 100, heat of the resistors 2 is efficiently dissipated to the fixing target 100 through the embedding resin 6.

In addition, the placement member 7 is made of resin and contains a base resin and a filler having a higher thermal conductivity than the base resin. The thermal conductivity of the placement member 7 can thereby be increased. As a result, in the state in which the surge suppression device 1 is fixed to the fixing target 100, heat of members (in the first embodiment, the substrate 8 including the capacitors 3) placed on the placement member 7 is efficiently dissipated to the fixing target 100 through the placement member 7.

As described above, according to the first embodiment, it is possible to provide a surge suppression device that can be reduced in thickness.

Second Embodiment

Figure 7:
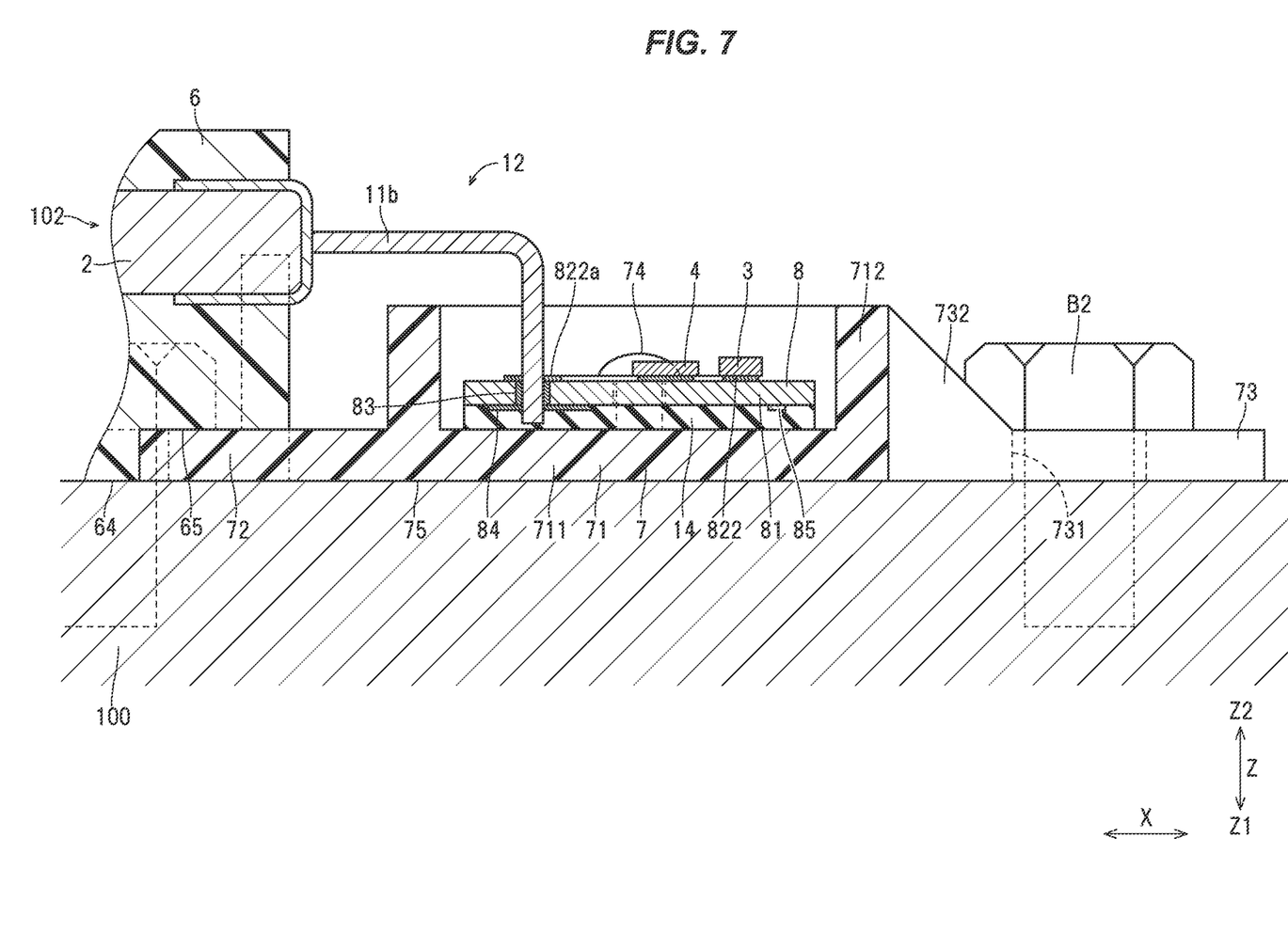
FIG. 7 is an enlarged cross-sectional view showing a portion around the placement member of the surge suppression device in the second embodiment.

FIG. 7 is an enlarged cross-sectional view showing a portion around the placement member 7 of the surge suppression device 1 in the second embodiment. FIG. 7 is a diagram corresponding to FIG. 5 in the first embodiment.

The second embodiment is an example in which the sealing resin (see the reference sign 13 in FIGS. 2, 3 and 5) in the placement member 7 is eliminated from the first embodiment and a heat conductive sheet 14 is added. The heat conductive sheet 14 is made of a thermally conductive and easily deformable material (e.g., silicone) and is formed in a plate shape. To place the heat conductive sheet 14 and the substrate 8 on the placement member 7, the heat conductive sheet 14 and the substrate 8 are stacked in this order on the bottom portion 711 of the placement portion 71, the heat conductive sheet 14 is deformed and adhered to the substrate 8 and the bottom portion 711 by pressing the substrate 8 toward the fixed side Z1, and the heat conductive sheet 14 and the substrate 8 are caulked at the caulking portion 74. In the second embodiment, the side portion 712 of the placement portion 71 may be eliminated since the sealing resin (see the reference sign 13 in FIGS. 2, 3 and 5) is not provided, but it is preferable to form the side portion 712 to prevent contact between the substrate 8 and other members.

The other configurations in the second embodiment are the same as in the first embodiment.

Among the reference signs used in the second embodiment onwards, the same reference signs as those used in the already-described embodiment indicate the same constituent elements, etc., as those in the already-described embodiment, unless otherwise specified.

Functions and Effects of the Second Embodiment

The second embodiment also has the same functions and effects as those in the first embodiment.

Summary of the Embodiments

Technical ideas understood from the embodiments will be described below citing the reference signs, etc., used for the embodiments. However, each reference sign, etc., described below is not intended to limit the constituent elements in the claims to the members, etc., specifically described in the embodiments.

According to the first feature, a surge suppression device 1, comprising: a plurality of series circuits 101-103 each comprising a resistor 2 and a capacitor 3 that are connected in series; an embedding resin 6 that embeds a plurality of the resistors 2 constituting the plurality of series circuits 101-103; and a placement member 7 that places a plurality of the capacitors 3 constituting the plurality of series circuits 101-103, wherein the plurality of resistors 2 are arranged in parallel, and wherein the embedding resin 6 and the placement member 7 are aligned in a direction of a plane parallel to both a resistor longitudinal direction X being a longitudinal direction of the resistor 2 and a resistor alignment direction Y in which the plurality of resistors 2 are aligned.

According to the second feature, in the surge suppression device 1 as described by the first feature, an embedding resin attachment surface 64 of the embedding resin 6 located on a fixing target 100 side of the surge suppression device 100 and a placement member attachment surface 75 of the placement member 7 located on the fixing target 100 side are formed coplanar.

According to the third feature, in the surge suppression device 1 as described by the first or second feature, the placement member 7 comprises a placement portion 71 that places the capacitor 3 and an extension portion 72 extending from the placement portion 71 toward the embedding resin 6, and the placement member 7 is integrated with the embedding resin 6 at the extension portion 72.

According to the fourth feature, in the surge suppression device 1 as described by the third feature, when an externally exposed portion of a conductive path from the resistor 2 to the capacitor 3 in each of the series circuits 101-103 is defined as an exposed conductive portion 12 and the fixing target 100 side relative to the surge suppression device 1 is defined as a fixed side Z1, the extension portion 72 is located on the fixed side Z1 of the exposed conductive portion 12.

According to the fifth feature, in the surge suppression device 1 as described by the third or fourth feature, the embedding resin 6 comprises an embedding resin fixing portion 63 that fixes the surge suppression device 1 to the fixing target 100, and at least a portion of the extension portion 72 and at least a portion of the embedding resin fixing portion 63 are arranged at the same position in an alignment direction X of the embedding resin 6 and the placement member 7.

According to the sixth feature, in the surge suppression device 1 as described by any one of the first to fifth features, the embedding resin 6 comprises an embedding resin fixing portion 63 that fixes the surge suppression device 1 to the fixing target 100, and the placement member 7 comprises a placement member fixing portion 73 that fixes to the fixing target 100.

According to the seventh feature, in the surge suppression device 1 as described by any one of the first to sixth features, the plurality of capacitors 3 are mounted on a substrate 8 that has a thickness in a direction Z intersecting both the resistor longitudinal direction X and the resistor alignment direction Y, and the substrate 8 is placed on the placement member 7.

According to the eighth feature, in the surge suppression device 1 as described by the seventh feature, the substrate 8 comprises a front-side pattern 821, 822 on which the plurality of capacitors 3 are mounted, a heat dissipation via 83 connected to a conductive path of the front-side pattern 821, 822 between the resistor 2 and the capacitor 3, and a back-side heat dissipation pattern 84 formed on the substrate 8 on an opposite side to a side with the front-side pattern 821, 822 and connected to the heat dissipation via 83.

According to the ninth feature, in the surge suppression device 1 as described by any one of the first to eighth features, the embedding resin 6 comprises a base resin and a filler having a higher thermal conductivity than the base resin.

According to the tenth feature, in the surge suppression device 1 as described by any one of the first to ninth features, the placement member 7 comprises resin and includes a base resin and a filler having a higher thermal conductivity than the base resin.

Additional Note

Although the embodiments of the invention have been described, the invention according to claims is not to be limited to the embodiments described above. Further, please note that not all combinations of the features described in the embodiments are necessary to solve the problem of the invention. In addition, the invention can be appropriately modified and implemented without departing from the gist thereof.

For example, in each of the above-described embodiments, an easily deformable heat conductive sheet may be provided to be interposed between the embedding resin attachment surface/the placement member attachment surface and the fixing target to reduce a gap between the embedding resin attachment surface/the placement member attachment surface and the fixing target, thereby improving heat dissipation from the surge suppression device to the fixing target.

In addition, in each of the above-described embodiments, the alignment direction of the embedding resin and the placement member may coincide with the resistor alignment direction.

In addition, in each of the above-described embodiments, the embedding resin attachment surface may be out of alignment with the placement member attachment surface as long as the embedding resin attachment surface and the placement member attachment surface are arranged side by side in the direction of the plane parallel to both the resistor longitudinal direction and the resistor alignment direction. For example, in case that, e.g., it is necessary to attach the surge suppression device to a stepped portion of the fixing target, misalignment of the embedding resin attachment surface with the placement member attachment surface makes it easy that fixes the surge suppression device to the fixing target.

In addition, as a reference configuration, the shape of the resistor may be changed to a shape which is not long, such as a circle or a sphere, in each of the above-described embodiments.

The invention claimed is:
1. A surge suppression device, comprising:
   a plurality of series circuits each comprising a resistor and a capacitor that are connected in series;
   an embedding resin that embeds a plurality of the resistors constituting the plurality of series circuits; and
   a placement member that places a plurality of the capacitors constituting the plurality of series circuits,
   wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned, wherein an embedding resin attachment surface of the embedding resin located on a fixing target side of the surge suppression device and a placement member attachment surface of the placement member located on the fixing target side are formed coplanar.

2. The surge suppression device according to claim 1, wherein the placement member comprises a placement portion that places the capacitor and an extension portion extending from the placement portion toward the embedding resin, and wherein the placement member is integrated with the embedding resin at the extension portion.

3. A surge suppression device, comprising:
a plurality of series circuits each comprising a resistor and a capacitor that are connected in series;
an embedding resin that embeds a plurality of the resistors constituting the plurality of series circuits; and
a placement member that places a plurality of the capacitors constituting the plurality of series circuits,
wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned,
wherein when an externally exposed portion of a conductive path from the resistor to the capacitor in each of the series circuits is defined as an exposed conductive portion and a fixing target side relative to the surge suppression device is defined as a fixed side, the extension portion is located on the fixed side of the exposed conductive portion.

4. A surge suppression device, comprising:
a plurality of series circuits each comprising a resistor and a capacitor that are connected in series;
an embedding resin that embeds a plurality of the resistors constituting the plurality of series circuits; and
a placement member that places a plurality of the capacitors constituting the plurality of series circuits,
wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned,
wherein the embedding resin comprises an embedding resin fixing portion that fixes the surge suppression device to a fixing target, and wherein at least a portion of an extension portion and at least a portion of the embedding resin fixing portion are arranged at a same position in an alignment direction of the embedding resin and the placement member.

5. A surge suppression device, comprising:
a plurality of series circuits each comprising a resistor and a capacitor that are connected in series;
an embedding resin that embeds a plurality of the resistors constituting the plurality of series circuits; and
a placement member that places a plurality of the capacitors constituting the plurality of series circuits,
wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned,
wherein the embedding resin comprises an embedding resin fixing portion that fixes the surge suppression device to a fixing target, and wherein the placement member comprises a placement member fixing portion that fixes to the fixing target.

6. A surge suppression device, comprising:
a plurality of series circuits each comprising a resistor and a capacitor that are connected in series;
an embedding resin that embeds a plurality of the resistors constituting the plurality of series circuits; and
a placement member that places a plurality of the capacitors constituting the plurality of series circuits,
wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned,
wherein the plurality of capacitors are mounted on a substrate that has a thickness in a direction intersecting both the resistor longitudinal direction and the resistor alignment direction, and wherein the substrate is placed on the placement member.

7. The surge suppression device according to claim 6, wherein the substrate comprises a front-side pattern on which the plurality of capacitors are mounted, a heat dissipation via connected to a conductive path of the front-side pattern between the resistor and the capacitor, and a back-side heat dissipation pattern formed on the substrate on an opposite side to a side with the front-side pattern and connected to the heat dissipation via.

8. A surge suppression device, comprising:
a plurality of series circuits each comprising a resistor and a capacitor that are connected in series;
an embedding resin that embeds a plurality of the resistors constituting the plurality of series circuits; and
a placement member that places a plurality of the capacitors constituting the plurality of series circuits,
wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned,
wherein the embedding resin comprises a base resin and a filler having a higher thermal conductivity than the base resin.

9. A surge suppression device, comprising:
a plurality of series circuits each comprising a resistor and a capacitor that are connected in series;
an embedding resin that embeds a plurality of the resistors constituting the plurality of series circuits; and
a placement member that places a plurality of the capacitors constituting the plurality of series circuits,
wherein the plurality of resistors are arranged in parallel, and wherein the embedding resin and the placement member are aligned in a direction of a plane parallel to both a resistor longitudinal direction being a longitudinal direction of the resistor and a resistor alignment direction in which the plurality of resistors are aligned,
wherein the placement member comprises resin and includes a base resin and a filler having a higher thermal conductivity than the base resin.

* * * * *